US012463607B2

(12) United States Patent
Zhao et al.

(10) Patent No.: US 12,463,607 B2
(45) Date of Patent: Nov. 4, 2025

(54) DOHERTY AMPLIFIER

(71) Applicant: Ampleon Netherlands B.V., Nijmegen (NL)

(72) Inventors: Junlei Zhao, Nijmegen (NL); Yi Zhu, Nijmegen (NL); Radjindrepersad Gajadharsing, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 444 days.

(21) Appl. No.: 18/183,766

(22) Filed: Mar. 14, 2023

(65) Prior Publication Data

US 2023/0299728 A1    Sep. 21, 2023

(30) Foreign Application Priority Data

Mar. 15, 2022 (NL) ..................... 2031290

(51) Int. Cl.
*H03F 1/02* (2006.01)
*H03F 3/21* (2006.01)

(52) U.S. Cl.
CPC ......... *H03F 3/211* (2013.01); *H03F 1/0288* (2013.01); *H03F 2200/451* (2013.01)

(58) Field of Classification Search
CPC ... H03F 3/211; H03F 1/0288; H03F 2200/451
USPC ............................. 330/124 R, 295
See application file for complete search history.

(56) References Cited

U.S. PATENT DOCUMENTS

| | | | |
|---|---|---|---|
| 12,294,360 B2 * | 5/2025 | de Vreede | .......... H03K 17/6871 |
| 2008/0246547 A1 | 10/2008 | Blednov | |
| 2011/0148527 A1 | 6/2011 | Bagga | |
| 2019/0198465 A1 | 6/2019 | Seebacher et al. | |
| 2021/0257977 A1 | 8/2021 | Cuoco et al. | |
| 2021/0408979 A1 * | 12/2021 | Komposch | .............. H03F 3/195 |
| 2024/0088838 A1 * | 3/2024 | Noori | .................. H01L 23/4824 |

OTHER PUBLICATIONS

International Type Report on Novelty Research, Application No. NL 2031290, dated Oct. 27, 2022, 9 pages.

* cited by examiner

*Primary Examiner* — Hafizur Rahman
(74) *Attorney, Agent, or Firm* — McDonnell Boehnen Hulbert & Berghoff LLP

(57) ABSTRACT

Example embodiments relate to Doherty amplifiers. One example includes a radiofrequency (RF) power amplifier. The RF power amplifier includes an input lead. The RF power amplifier also includes a first output lead. Additionally, the RF power amplifier includes a first semiconductor die arranged in between the input lead and the first output lead. The first semiconductor die includes a first edge arranged adjacent to the input lead and an opposing second edge arranged adjacent to the first output lead. Further, the RF power amplifier includes a field-effect transistor integrated on the first semiconductor die. The field-effect transistor includes a gate bondpad assembly and a drain bondpad assembly. The field-effect transistor also includes a plurality of gate bondwires and a plurality of drain bondwires. In addition, the field-effect transistor includes a plurality of gate fingers extending in a first direction and a plurality of drain fingers extending in a second direction.

20 Claims, 6 Drawing Sheets

DOHERTY AMPLIFIER

CROSS-REFERENCE TO RELATED APPLICATIONS

The present application is a non-provisional patent application claiming priority to Netherlands Patent Application No. NL 2031290, filed Mar. 15, 2022, the contents of which are hereby incorporated by reference.

FIELD OF THE DISCLOSURE

The present disclosure relates to a radiofrequency (RF) power amplifier, and to an RF power amplifier system that includes an RF power amplifier. The present disclosure further relates to a Doherty amplifier in which this RF power amplifier is used as the main and/or peak amplifier. The present disclosure particularly relates to RF power amplifiers, RF power amplifier systems, and Doherty amplifiers configured to be used in multiple input multiple output (MIMO) systems. Such amplifiers and amplifier systems typically output powers in a range between 1 and 50 Watts in a frequency range from 0.2 to 7 GHz.

BACKGROUND

RF power amplifiers may include an input lead, a first output lead, and a first semiconductor die arranged in between the input lead and the first output lead and having a first edge arranged adjacent to the input lead and an opposing second edge arranged adjacent to the first output lead. On the first semiconductor die a field-effect transistor (FET) is integrated that includes a gate bondpad assembly, a plurality of gate bondwires electrically connecting the input lead to the gate bondpad assembly either directly or indirectly. The FET further includes a drain bondpad assembly, and a plurality of drain bondwires electrically connecting the first output lead to the drain bondpad assembly directly or indirectly. Gate fingers of the FET extend in a first direction from the gate bondpad assembly towards the drain bondpad assembly, and drain fingers of the FET extend in a second direction opposite to the first direction from the drain bondpad assembly towards the gate bondpad assembly.

In an example RF amplifier, the gate bondpad assembly is arranged in between the first edge and the drain bondpad assembly, and the drain bondpad assembly is arranged in between the second edge and the gate bondpad assembly.

The gate bondpad assembly and the drain bondpad assembly generally include a bondbar. Furthermore, the FET may include a silicon-based laterally diffused metal-oxide semiconductor (LDMOS) or a Gallium Nitride-based field-effect transistor.

SUMMARY

A general problem existing for RF power amplifiers is related to stability. More in particular, FETs have a gate-drain feedback capacitance connecting the output side of the FET to the input side. This capacitance may result in the power amplifier becoming unstable under certain operating conditions.

The present disclosure provides an RF power amplifier in which the abovementioned stability problem can be addressed. To that end, an RF power amplifier is described in that the FET further includes at least one auxiliary gate bondpad assembly, each auxiliary gate bondpad assembly being arranged spaced apart from the plurality of gate fingers in a respective direction perpendicular to the first direction, wherein each auxiliary gate bondpad assembly is arranged closer to the drain bondpad assembly than to the gate bondpad assembly when seen in the first direction, and wherein each auxiliary gate bondpad assembly is electrically connected to the gate bondpad assembly. The power amplifier further includes, for each of the at least one auxiliary gate bondpad assembly, one or more bondwires that each have a first end that is physically and electrically connected to that auxiliary gate bondpad assembly and a second end that is configured to be RF grounded during operation.

By using a shunt inductor in the form of bondwires arranged near the drain bondwires, the adverse effects of the gate-drain capacitance on the stability of the FET can at least be partially mitigated thereby improving the stability of the FET. To ensure sufficient electromagnetic coupling between the one or more bondwires and the plurality of drain bondwires, each auxiliary gate bondpad assembly is arranged closer to the drain bondpad assembly than to the gate bondpad assembly when seen in the first direction.

To prevent a direct current (DC) short between the gate of the FET and ground, the one or more bondwires can be arranged in series with a DC blocking capacitor which can be arranged inside or outside the power amplifier.

The first semiconductor die may include an upper surface at and/or near which the field-effect transistor is integrated. For each of the at least one auxiliary gate bondpad assembly, an average direction in which the plurality of drain bondwires extend from the drain bondpad assembly taken in a plane parallel to the upper surface can be at an angle with an average direction in which the one or more bondwires extend from that auxiliary bondpad assembly in said plane, wherein the angle is in a range from −120 to +120 degrees. In some embodiments, the angle can be in a range from −90 to +90 degrees (e.g., from −85 degrees to +85 degrees, such as from −60 to +60 degrees). Here, it is noted that an angle of zero degrees corresponds to the average directions being parallel.

An average direction for a plurality of bondwires taken in the plane parallel to the upper surface can be determined by representing each bondwire by a vector of equal length in that plane, wherein the vector corresponds to the direction of that bondwire in the plane parallel to the upper surface. By adding all vectors for all bondwires, an average direction can be found.

Each of the at least one auxiliary gate bondpad assembly can be electrically connected to the gate bondpad assembly via the gate fingers. Typically, a gate finger includes a plurality of metal layers. A first metal layer makes contact to the semiconductor die and higher metal layers, which are connected to the first metal layer and are provided to reduce the ohmic resistance of the gate finger. Hereinafter, the combination of the finger-like structures in the various metal layers will be referred to as a gate finger. In some embodiments, the at least one auxiliary gate bondpad assembly is not connected directly to the gate bondpad assembly, but instead via the gate fingers. For example, the FET may include, for each of the at least one auxiliary gate bondpad assembly, a respective conductive track that physically connects that auxiliary gate bondpad assembly to the plurality of gate fingers. The position at which the conductive track connects to a gate finger may correspond to a position along that gate finger that falls within the last 50 percent of that gate finger (e.g., the last 25 percent of that gate finger), taking the gate bondpad assembly as the starting point of that gate finger.

At least one auxiliary gate bondpad assembly can be arranged adjacent the drain bondpad assembly. In such embodiments, the position in the first direction of the drain bondpad assembly and the auxiliary gate bondpad assembly relative to the first edge can be substantially identical.

The power amplifier may further include a substrate (e.g., a heat-conducting and/or electrically conductive substrate) on which the first semiconductor die is mounted. This substrate can be a copper or copper-based substrate.

The power amplifier may further include at least one DC blocking capacitor, each DC blocking capacitor having a first terminal that is configured to be electrically grounded during operation and a second terminal, wherein the second ends of the one or more bondwires for at least one auxiliary gate bondpad assembly are physically connected to the second terminal of a respective DC blocking capacitor among the at least one DC blocking capacitor. The power amplifier may include at least one second semiconductor die on which the at least one DC blocking capacitor is integrated.

The power amplifier may include a third semiconductor die on which a matching capacitor is arranged that has a grounded first terminal and a second terminal. In this case, the plurality of drain bondwires physically and electrically connect the drain bondbar assembly to the second terminal of the matching capacitor. In addition, the power amplifier further includes drain bondwires that physically and electrically connect the second terminal to the first output lead. The at least one second semiconductor die can be at least partially arranged in between the third semiconductor die and the first semiconductor die. Alternatively, one or all of the second semiconductor dies may be the same die as the third semiconductor die.

Instead of the at least one DC blocking capacitor being arranged in between the auxiliary gate bondpad assembly and ground, the at least one DC blocking capacitor can be electrically connected in between the gate bondpad assembly and the at least one auxiliary gate bondpad assembly. In this case, the at least one DC blocking capacitor is integrated on the first semiconductor die. Furthermore, the at least one DC blocking capacitor may be arranged in between the at least one auxiliary gate bondpad assembly and the plurality of gate fingers.

In the examples above, the at least one DC blocking capacitor was part of the RF amplifier. In some embodiments, though, the power amplifier may also include at least one second output lead (e.g., arranged adjacent the first output lead), wherein for at least one auxiliary gate bondpad assembly, the second ends of the one or more bondwires for that auxiliary gate bondpad assembly, are physically connected to a second output lead of the at least one second output lead. In such embodiments, grounding of the one or more bondwires may be achieved on the printed circuit board or other carrier on which the power amplifier is mounted.

Electrical grounding of the FET (e.g., as required for the source connection) may be achieved through the first semiconductor die. To this end, the first semiconductor die may be provided with through vias or the first semiconductor die may have a conductive substrate. In such embodiments, the substrate of the power amplifier on which the first semiconductor die is mounted not only functions as a heat sink but also as electrical ground. Alternatively, a ground connection is achieved using one or more bondwires extending from the first semiconductor die to a dedicated ground lead of the RF power amplifier.

The power amplifier may further include a package body made of a solidified molding compound that fixates the input lead, the first output lead, and, optionally, the at least one second output lead relative to the substrate. The power amplifier may further include a lid that is fixedly connected to the package body, thereby defining a cavity in which the first semiconductor die and the second and third semiconductor die(s), if applicable, are arranged. The lid can also be made using a solidified molding compound. In some embodiments, the molding compound encapsulates all the components of the power amplifier. In such embodiments, no cavity exists inside the power amplifier.

The at least one auxiliary gate bondpad assembly may include a pair of auxiliary gate bondpad assemblies arranged on opposite sides of the plurality of gate bondwires. The gate bondpad assembly, the drain bondpad assembly, and/or the at least one auxiliary gate bondpad assembly may include at least one bondpad and/or a bondbar. Furthermore, the field-effect transistor may include a silicon-based LDMOS or a Gallium Nitride-based field-effect transistor.

According to a second aspect, a power amplifier system is provided that includes a printed circuit board on which the power amplifier, as described above, without the internal DC blocking capacitor(s) is mounted. The power amplifier system further includes at least one DC blocking capacitor mounted on the printed circuit board and having a grounded terminal and a non-grounded terminal, wherein the non-grounded terminal of each DC blocking capacitor is electrically connected to a respective second output lead.

According to a third aspect, a Doherty amplifier is provided that includes a Doherty splitter arranged for splitting an input RF signal into a main RF signal and a peak RF signal, a main amplifier for amplifying the main RF signal, a peak amplifier for amplifying the peak RF signal, and a Doherty combiner for combining the amplified main RF signal and the amplified peak RF signal into an output RF signal. At least one of the main amplifier and peak amplifier includes the power amplifier or the power amplifier system as described above.

The main amplifier and the peak amplifier may share a same substrate. In such embodiments, the main amplifier and peak amplifier are realized using a single package. In such cases, the package body of the power amplifier of the main amplifier and the package body of the power amplifier of the peak amplifier may form a single contiguous package body.

BRIEF DESCRIPTION OF THE DRAWINGS

Next, example embodiments will be described in more detail referring to appended drawings, wherein identical or similar components will be referred to using the same reference numerals.

DETAILED DESCRIPTION

Figure 1:
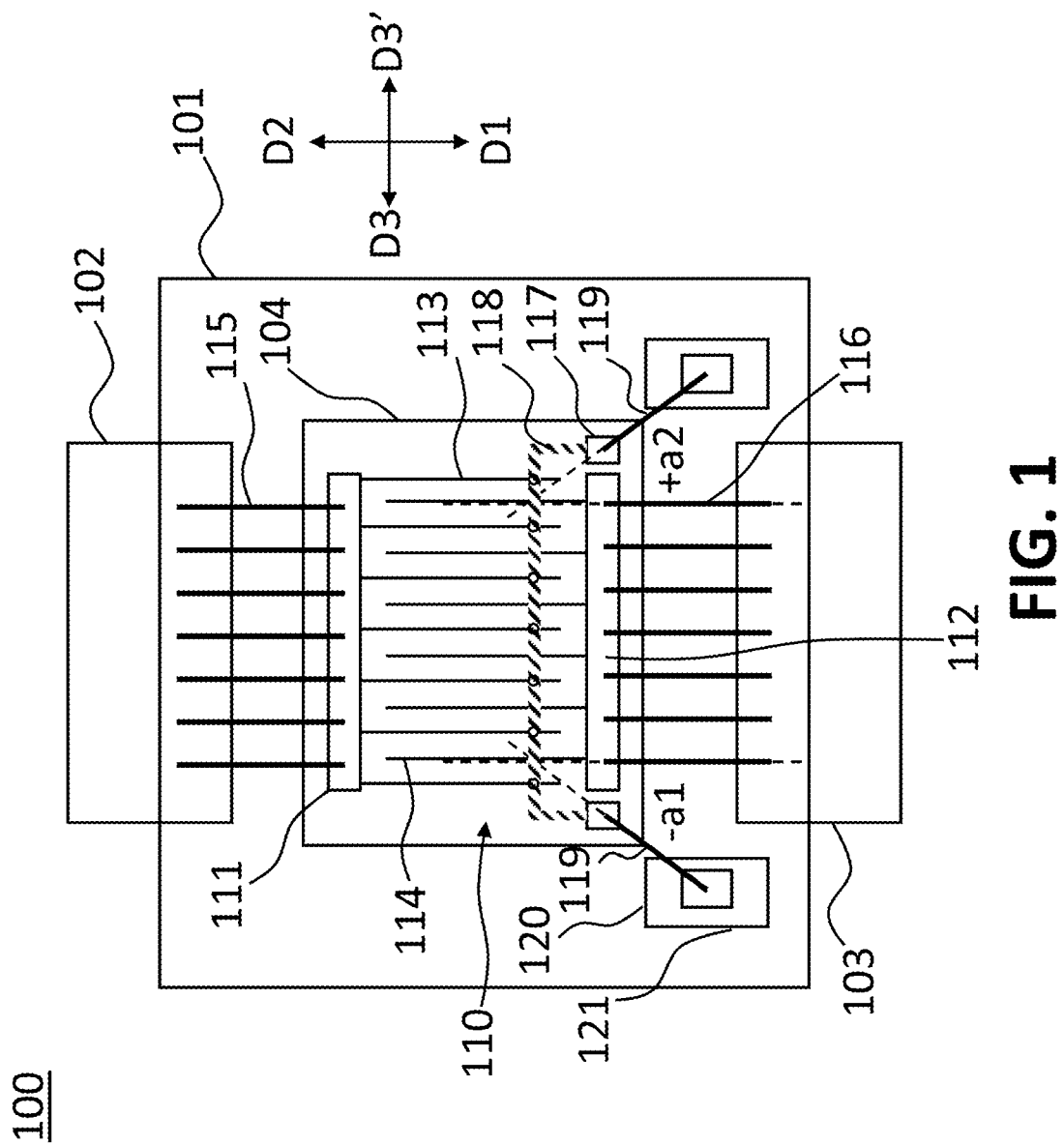
FIG. 1 illustrates an RF power amplifier with internal DC blocking capacitors, according to example embodiments.

FIG. 1 illustrates an RF power amplifier 100, according to example embodiments. RF power amplifier 100 includes a substrate 101, an input lead 102, and a first output lead 103. On substrate 101, which can be embodied as a heat conducting and/or electrically conducting substrate, a first semiconductor die 104 is mounted on which a FET 110 is integrated.

FET 110 includes a gate bondbar 111 and a drain bondbar 112. A plurality of gate fingers 113 extend in a first direction D1 from gate bondbar 111 towards drain bondbar 112. Similarly, a plurality of drain fingers 114 extend in a second direction D2 from drain bondbar 112 towards gate bondbar 111.

A plurality of gate bondwires 115 connects gate bondbar 111 to input lead 102. Similarly, a plurality of drain bondwires 116 connects drain bondbar 112 to first output lead 103.

FET 110 further includes a pair of auxiliary gate bondpads 117 that are connected, using a conductive track 118, to the plurality of gate fingers 113. The position at which the connection is made is indicates using circles.

Bondwires 119 extend between auxiliary gate bondpads 117 and a pair of second semiconductor dies 120 on which a DC blocking capacitor is integrated. This capacitor has a non-grounded terminal 121 that is electrically connected to a bondwire 119. The other terminal of the DC blocking capacitor is electrically grounded during operation. For example, the other terminal is electrically connected to a conductive substrate of second semiconductor die 120. As the second semiconductor die 120 is mounted on a conductive substrate 101, which is grounded during operation, suitable grounding of the DC blocking capacitor can be achieved.

In FIG. 1, one bondwire 119 makes an angle −a1 relative to an average direction of the plurality of drain bondwires 116, which corresponds to direction D1, whereas the other bondwire 119 makes an angle +a2 relative to this average direction. The manner in which these angles are determined is illustrated using hashed lines. Typically, both a1 and a2 lie in a range between 0 and 120 degrees (e.g., in a range between 0 and 90 degrees, such as between 0 and 60 degrees).

As illustrated, auxiliary gate bondpad 117 is shifted in a third direction D3' relative to the plurality of gate fingers 113. Moreover, auxiliary gate bondpad 117 is located closer to drain bondbar 112 than to gate bondbar 111.

By choosing the bondwire length and angle a1, a2 of bondwire 119, the compensation of the gate-drain capacitance of FET 110 can be optimized without having to re-design the layout of first semiconductor die 104.

Figure 2:
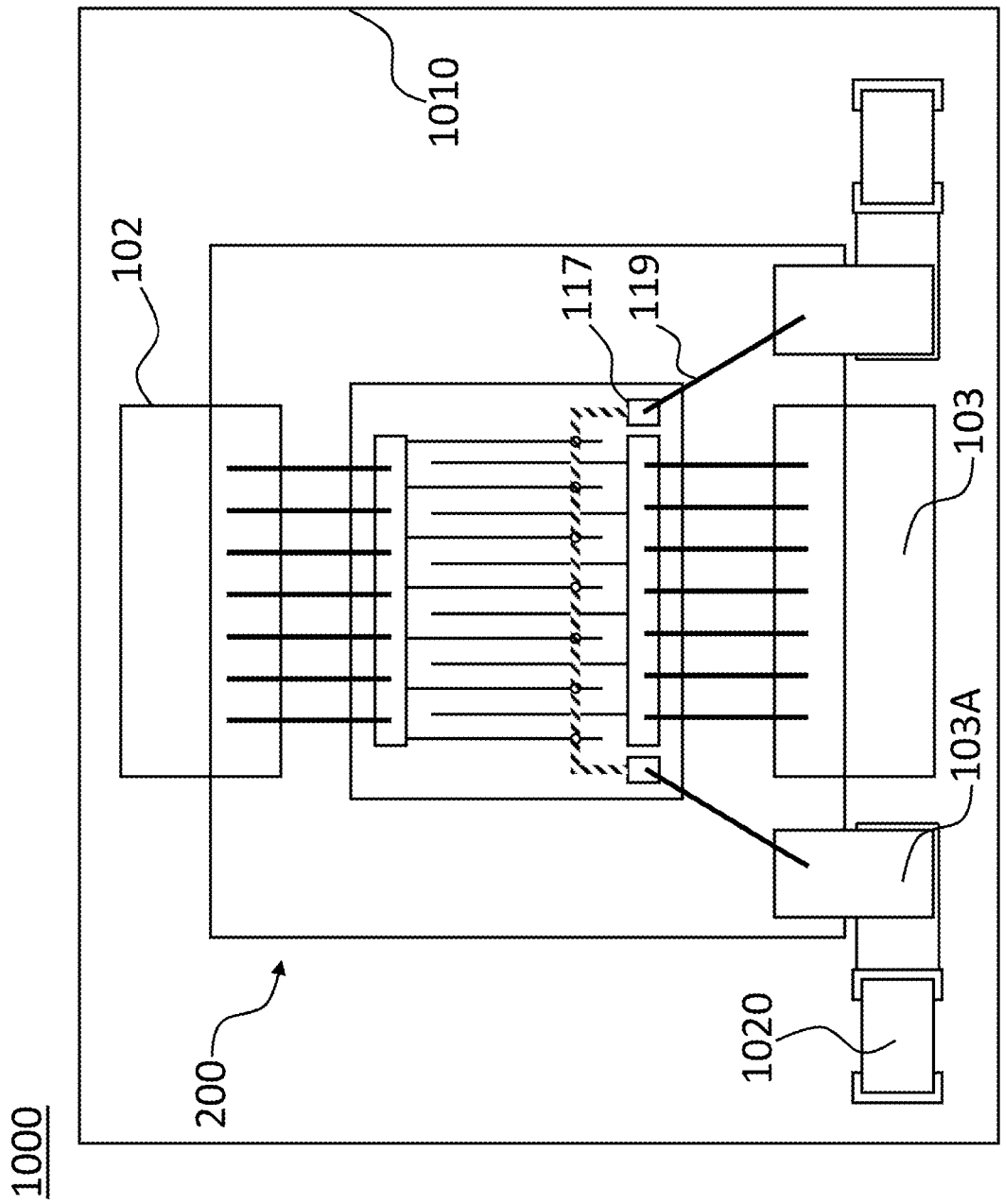
FIG. 2 illustrates an RF power amplifier system where the RF power amplifier has no internal DC blocking capacitors, according to example embodiments.

FIG. 2 illustrates an RF power amplifier system 1000, according to example embodiments. RF power amplifier system 1000 includes an RF power amplifier 200 and a printed circuit board 1010 on which RF power amplifier 200 is mounted. RF power amplifier 200 has no internal DC blocking capacitors. Instead, RF power amplifier 200 includes a pair of second output leads 103A that are connected on printed circuit board 1010 to respective lumped DC blocking capacitors 1020 (e.g., surface mount device (SMD) capacitors).

Figure 3:
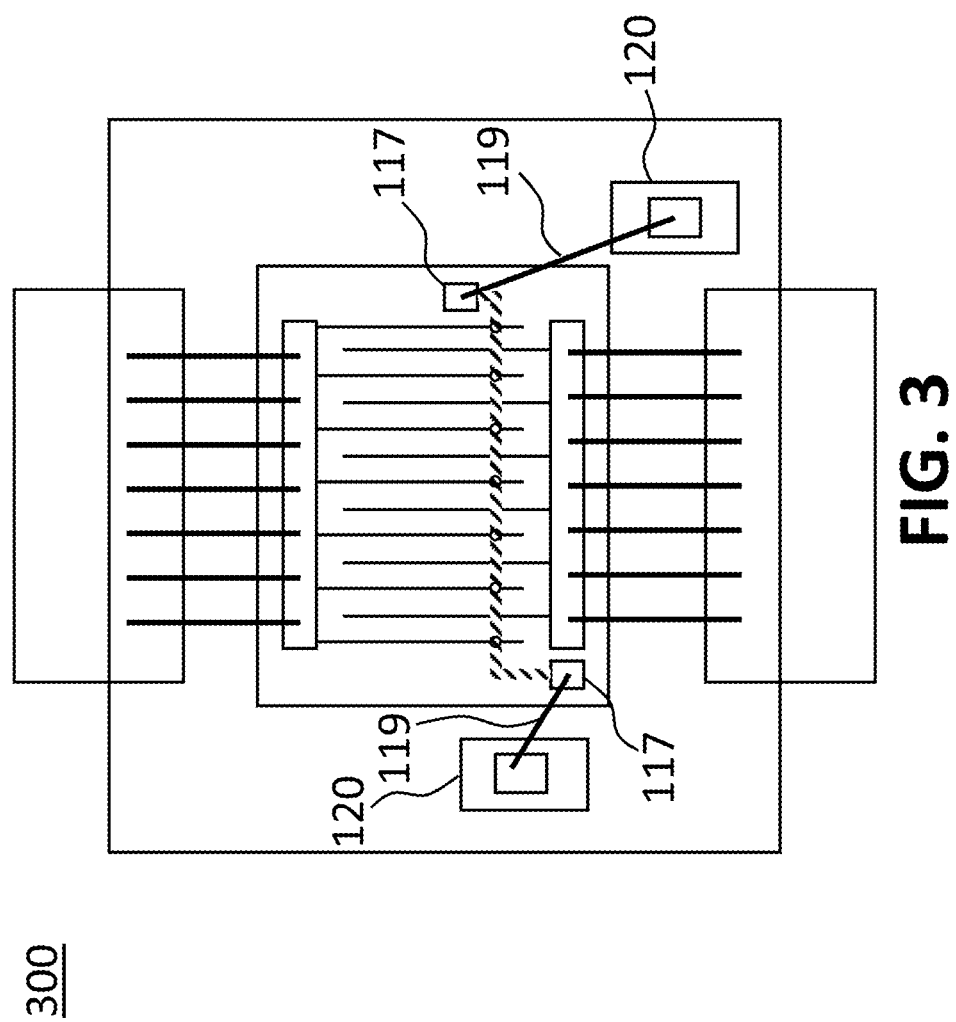
FIG. 3 illustrates an RF power amplifier with internal DC capacitors, according to example embodiments.
Figure 4:
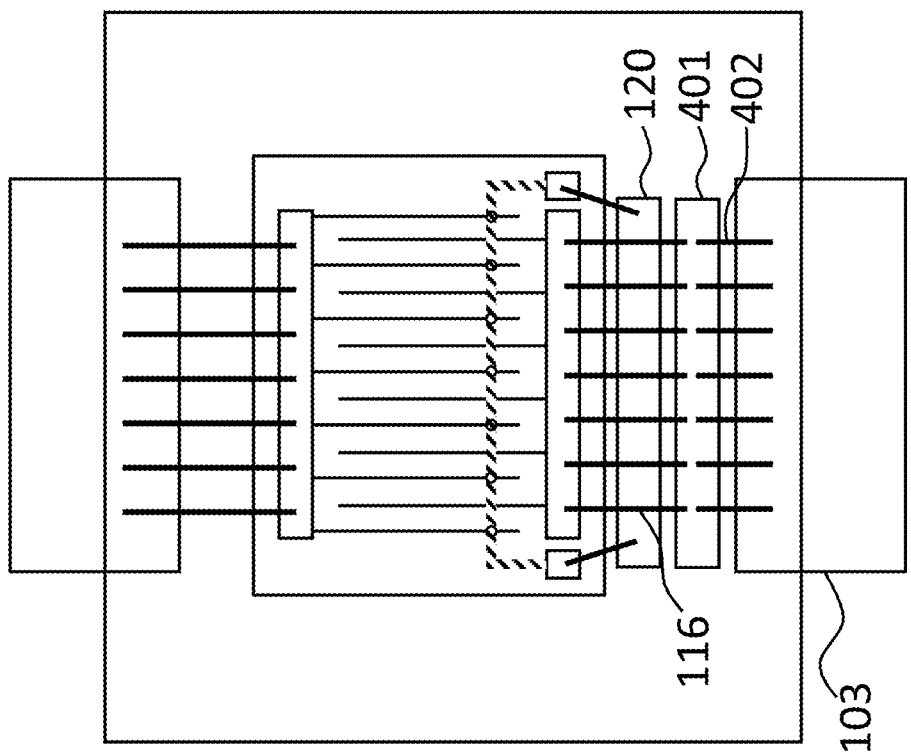
FIG. 4 illustrates an RF power amplifier with internal DC capacitors, according to example embodiments.

FIGS. 3, 4, and 5A illustrate further embodiments of RF power amplifiers with internal DC capacitors.

RF power amplifier 300 shown in FIG. 3 differs from RF power amplifier 100 shown in FIG. 1 in that the positions of auxiliary gate bondpads 117 and the positions of second semiconductor dies 120 are different.

RF power amplifier 400 shown in FIG. 4 differs from RF power amplifier 100 shown in FIG. 1 in that a single second semiconductor die 120 is used. On this semiconductor die, two separate DC blocking capacitors or a single, large DC blocking capacitor can be integrated. In addition, RF power amplifier 400 includes a third semiconductor die 401 on which a matching capacitor is arranged. This matching capacitor has a non-grounded terminal that is connected to the plurality of drain bondwires 116 and to a further plurality of drain bondwires 402 by which the non-grounded terminal is connected to output lead 103.

Figure 5:
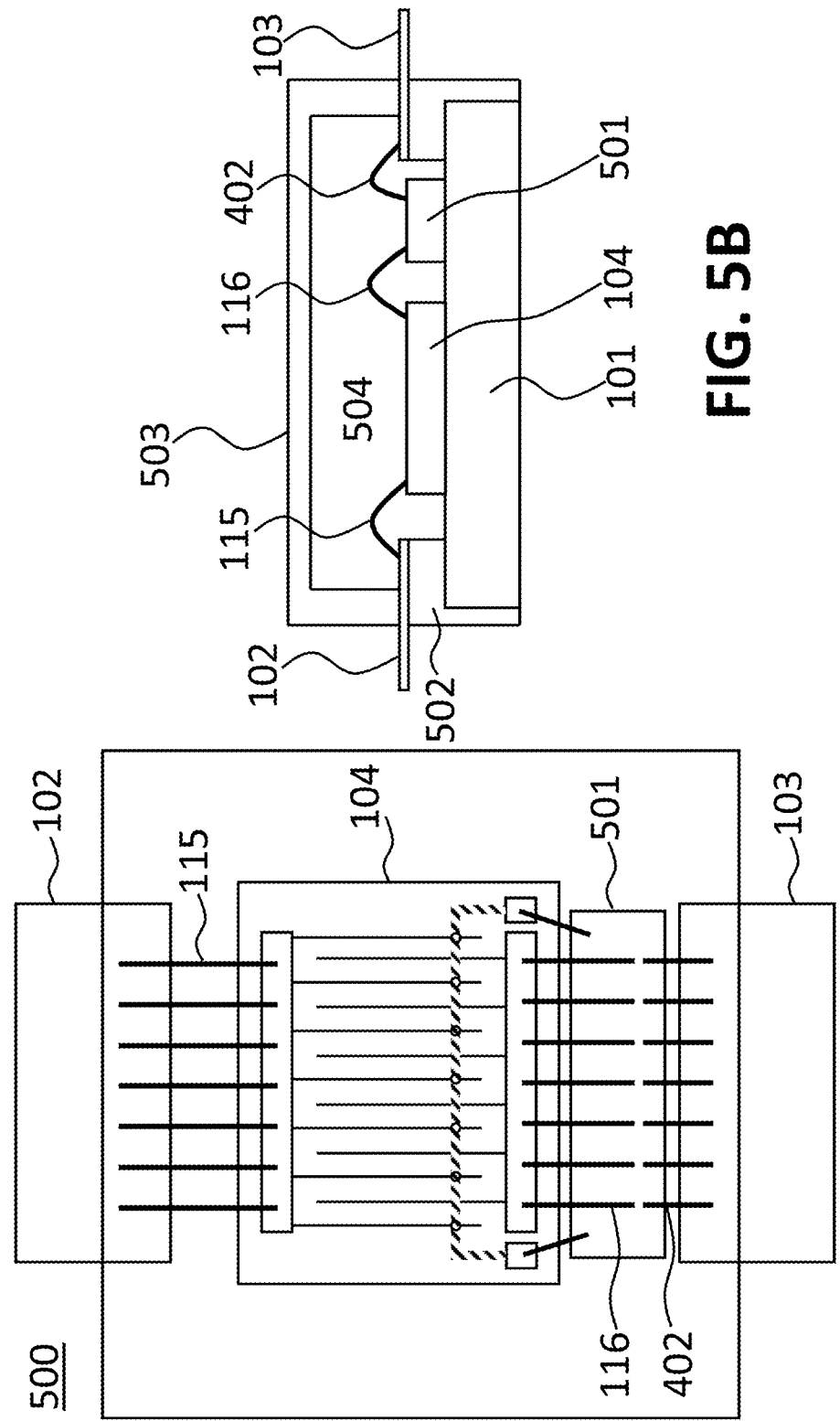
FIG. 5A illustrate an RF power amplifier with internal DC capacitors, according to example embodiments.
FIG. 5B illustrates a cross-section corresponding to the RF power amplifier of FIG. 5A, according to example embodiments.

RF power amplifier 500 shown in FIG. 5 differs from RF power amplifier 400 shown in FIG. 4 in that single semiconductor die 501 is used on which the DC blocking capacitor(s) and the matching capacitor are integrated. A corresponding cross-section is shown in FIG. 5B.

RF power amplifier 500 includes a package body 502 of solidified molding compound that fixes substrate 101 relative to input lead 102 and output lead 103. A lid 503 is fixedly connected to package body 502, thereby defining a cavity 504 in which the first semiconductor die 104 and the semiconductor die 501 are arranged.

Figure 6:
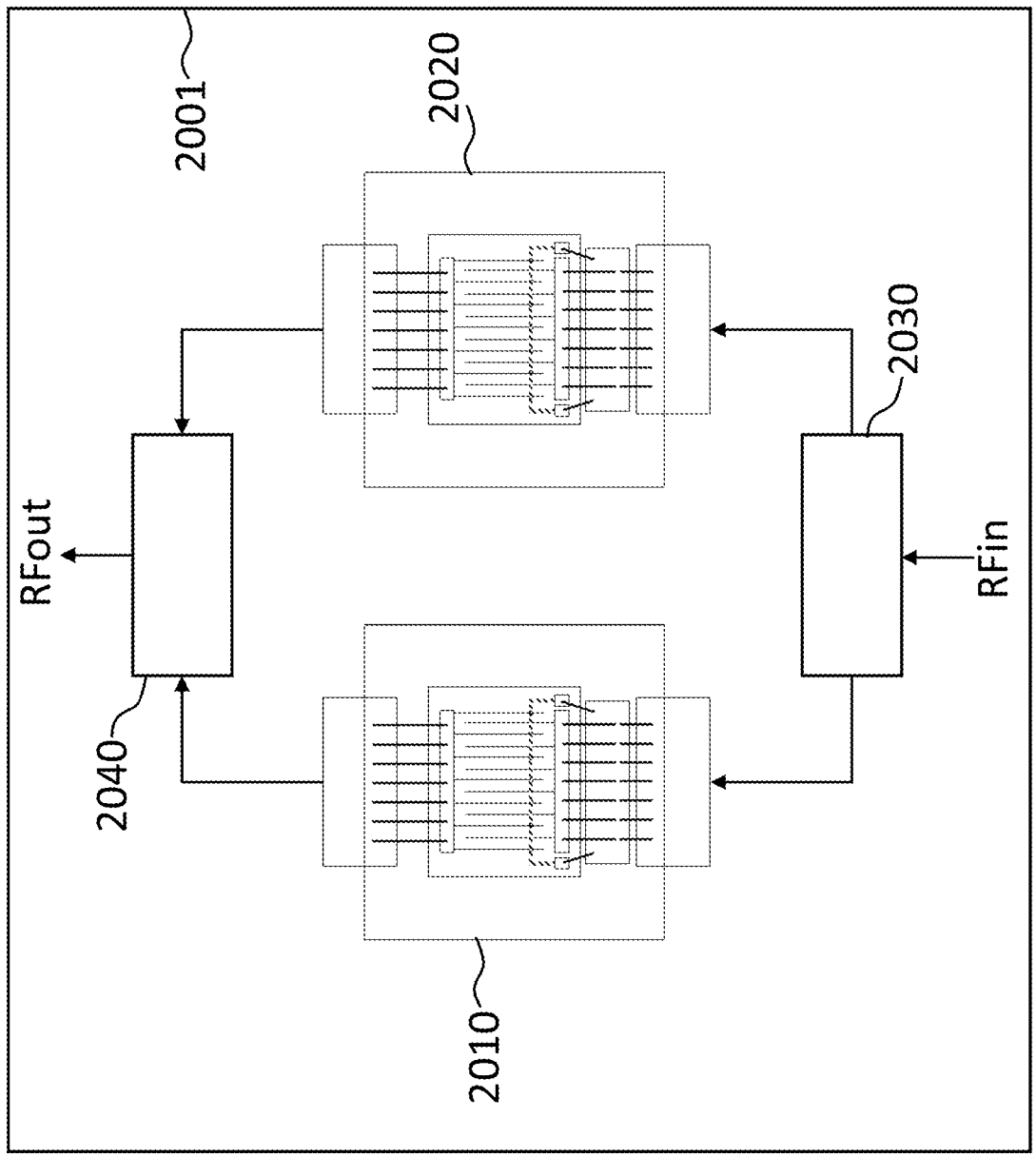
FIG. 6 illustrates a Doherty amplifier in which the RF power amplifier of FIG. 5A is used as main and peak amplifier, according to example embodiments.

FIG. 6 illustrates a Doherty amplifier 2000, according to example embodiments. Doherty amplifier 2000 includes a main amplifier 2010 and a peak amplifier 2020 that are both realized using RF power amplifier 500 and that are mounted on printed circuit board 2001. It should be noted that the power capabilities of the RF power amplifiers 500 may be identical, resulting in a symmetric Doherty amplifier, but they may also be different, resulting in an asymmetric Doherty amplifier.

Doherty amplifier 2000 includes a Doherty splitter 2030 that receives an RF input signal RFin and that splits RFin into a main signal and a peak signal that are provided to main amplifier 2010 and peak amplifier 2020, respectively. After amplification, Doherty combiner 2040 combines the amplified main and peak signals and outputs the combined signal as the RF output signal RFout. Doherty splitter 2030 and Doherty combiner 2040 are typically formed and/or arranged on printed circuit board 2001.

Main amplifier 2010 and peak amplifier 2020 are biased differently such that, at low input powers, only main amplifier 2010 is operational. At high input powers, both main amplifier 2010 and peak amplifier 2020 are operational.

Doherty combiner 2040 provides an impedance inversion function such that, at low powers, main amplifier 2010 is presented with a higher impedance at its drain than at high powers. By using the impedance inversion, efficiency at low input powers can be improved while also obtaining good efficiency at high input powers.

Together, Doherty combiner 2040 and Doherty splitter 2030 ensure that the amplified signals add up in-phase in Doherty combiner 2040.

In the above, the present disclosure has been explained using detailed embodiments thereof. However, the present disclosure is not limited to these embodiments. Rather, various modifications to these embodiments are possible without deviating from the scope of the present disclosure, which is defined by the appended claims and their equivalents.

What is claimed is:

1. A radiofrequency (RF) power amplifier, comprising:
an input lead;
a first output lead;
a first semiconductor die arranged in between the input lead and the first output lead and having:
   a first edge arranged adjacent to the input lead; and
   an opposing second edge arranged adjacent to the first output lead; and
a field-effect transistor integrated on the first semiconductor die and comprising:
   a gate bondpad assembly;
   a plurality of gate bondwires that directly or indirectly electrically connect the input lead to the gate bondpad assembly;
   a drain bondpad assembly;
   a plurality of drain bondwires that directly or indirectly electrically connect the first output lead to the drain bondpad assembly;
   a plurality of gate fingers extending in a first direction from the gate bondpad assembly towards the drain bondpad assembly; and
   a plurality of drain fingers extending in a second direction opposite to the first direction from the drain bondpad assembly towards the gate bondpad assembly,
wherein the gate bondpad assembly is arranged in between the first edge and the drain bondpad assembly,
wherein the drain bondpad assembly is arranged in between the second edge and the gate bondpad assembly,
wherein the field-effect transistor further comprises at least one auxiliary gate bondpad assembly, each auxiliary gate bondpad assembly being arranged spaced apart from the plurality of gate fingers in a respective direction perpendicular to the first direction,
wherein each auxiliary gate bondpad assembly is arranged closer to the drain bondpad assembly than to the gate bondpad assembly when seen in the first direction,
wherein each auxiliary gate bondpad assembly is electrically connected to the gate bondpad assembly,
wherein the power amplifier further comprises, for each of the at least one auxiliary gate bondpad assembly, one or more bondwires that each have:
   a first end that is physically and electrically connected to that auxiliary gate bondpad assembly; and
   a second end that is configured to be RF grounded during operation.

2. The RF power amplifier according to claim 1,
wherein the first semiconductor die comprises an upper surface at or near which the field-effect transistor is integrated, and
wherein, for each of the at least one auxiliary gate bondpad assembly, an average direction in which the plurality of drain bondwires extend from the drain bondpad assembly taken in a plane parallel to the upper surface is at an angle with an average direction in which the one or more bondwires extend from that auxiliary bondpad assembly in said plane, said angle being in a range from −120 to +120 degrees.

3. The RF power amplifier according to claim 2, wherein said angle is in a range from −90 to +90 degrees.

4. The RF power amplifier according to claim 1,
wherein each of the at least one auxiliary gate bondpad assembly is electrically connected to the gate bondpad assembly via the plurality of gate fingers,
wherein the field-effect transistor comprises, for each of the at least one auxiliary gate bondpad assembly, a respective conductive track that physically connects that auxiliary gate bondpad assembly to the plurality of gate fingers, and
wherein the position at which the conductive track connects to a gate finger corresponds to a position along that gate finger that falls within the last 50 percent of that gate finger, taking the gate bondpad assembly as a starting point of that gate finger.

5. The RF power amplifier according to claim 1, wherein at least one auxiliary gate bondpad assembly is arranged adjacent the drain bondpad assembly.

6. The RF power amplifier according to claim 1, further comprising a heat-conducting or electrically conductive substrate on which the first semiconductor die is mounted.

7. The RF power amplifier according to claim 6, further comprising a package body made of a solidified molding compound that fixes the input lead and the first output lead relative to the substrate.

8. The RF power amplifier according to claim 6, further comprising at least one DC blocking capacitor, each DC blocking capacitor having a first terminal that is configured to be electrically grounded during operation and a second terminal, wherein the second ends of the one or more bondwires for at least one auxiliary gate bondpad assembly are physically connected to the second terminal of a respective DC blocking capacitor among the at least one DC blocking capacitor.

9. The RF power amplifier according to claim 8, further comprising:
   at least one second semiconductor die on which the at least one DC blocking capacitor is integrated;
   a third semiconductor die on which a matching capacitor is arranged that has a grounded first terminal and a second terminal, wherein the plurality of drain bondwires physically and electrically connect the drain bondpad assembly to the second terminal of the matching capacitor; and
   further drain bondwires that physically and electrically connect the second terminal to the first output lead.

10. The RF power amplifier according to claim 9, wherein the at least one further semiconductor die is at least partially arranged in between the third semiconductor die and the first semiconductor die.

11. The RF power amplifier according to claim 9, wherein at least one of the second semiconductor dies is the same die as the third semiconductor die.

12. The RF power amplifier according to claim 8, wherein the at least one DC blocking capacitor is electrically connected in between the gate bondpad assembly and the at least one auxiliary gate bondpad assembly.

13. The RF power amplifier according to claim 1, further comprising at least one second output lead, wherein, for at least one auxiliary gate bondpad assembly, the second ends of the one or more bondwires for that auxiliary gate bondpad assembly are physically connected to a second output lead of the at least one second output lead.

14. A power amplifier system, comprising:
   a printed circuit board;
   the RF power amplifier according to claim 13 mounted on the printed circuit board; and
   at least one DC blocking capacitor mounted on the printed circuit board and having a grounded terminal and a non-grounded terminal, wherein the non-grounded terminal of each DC blocking capacitor is electrically connected to a respective second output lead.

15. The RF power amplifier according to claim 1, wherein the at least one auxiliary gate bondpad assembly comprises a pair of auxiliary gate bondpad assemblies arranged on opposite sides of the plurality of gate bondwires.

16. The RF power amplifier according to claim 1, wherein the gate bondpad assembly, the drain bondpad assembly, or the at least one auxiliary gate bondpad assembly comprises at least one bondpad or a bondbar.

17. The RF power amplifier according to claim 1, wherein the field-effect transistor comprises a silicon-based laterally diffused metal-oxide semiconductor (LDMOS) or a Gallium Nitride-based field-effect transistor.

18. A Doherty amplifier, comprising:
a Doherty splitter arranged for splitting an input RF signal into a main RF signal and a peak RF signal;
a main amplifier for amplifying the main RF signal;
a peak amplifier for amplifying the peak RF signal; and
a Doherty combiner for combining the amplified main RF signal and the amplified peak RF signal into an output RF signal,
wherein the main amplifier and the peak amplifier each comprises the RF power amplifier according to claim 1.

19. The Doherty amplifier according to claim 18, wherein the RF power amplifier of the main amplifier and the RF power amplifier of the peak amplifier each comprises a substrate that is shared among the main amplifier and peak amplifier, and wherein the substrate is a heat-conducting or electrically conductive substrate on which the first semiconductor die is mounted.

20. The Doherty amplifier according to claim 19, wherein the RF power amplifier of the main amplifier and the RF power amplifier of the peak amplifier each further comprises a package body made of a solidified molding compound that fixes the input lead and the first output lead relative to the substrate, and wherein the package body of the RF power amplifier of the main amplifier and the package body of the RF power amplifier of the peak amplifier form a single contiguous package body.

* * * * *